United States Patent
Jacobson

(10) Patent No.: US 7,966,534 B1
(45) Date of Patent: Jun. 21, 2011

(54) IDENTIFYING BITSTREAM LOAD ISSUES IN AN INTEGRATED CIRCUIT

(75) Inventor: Neil G. Jacobson, Los Altos, CA (US)

(73) Assignee: Xilinx, Inc., San Jose, CA (US)

( * ) Notice: Subject to any disclaimer, the term of this patent is extended or adjusted under 35 U.S.C. 154(b) by 197 days.

(21) Appl. No.: 12/484,150

(22) Filed: Jun. 12, 2009

(51) Int. Cl.
*G01R 31/28* (2006.01)
*G01R 31/02* (2006.01)
*G06F 11/00* (2006.01)
*H03K 19/173* (2006.01)
*H03K 19/177* (2006.01)

(52) U.S. Cl. ... 714/725; 714/798; 714/742; 324/762.01; 326/38; 326/39

(58) Field of Classification Search .................. 714/725, 714/798, 742; 324/762.01; 326/38, 39
See application file for complete search history.

(56) References Cited

U.S. PATENT DOCUMENTS

| | | | |
|---|---|---|---|
| 7,030,647 B1 * | 4/2006 | White et al. | 326/38 |
| 7,375,551 B1 * | 5/2008 | White et al. | 326/40 |
| 7,710,147 B1 * | 5/2010 | White et al. | 326/38 |
| 2010/0020830 A1 * | 1/2010 | Ambilkar et al. | 370/512 |

* cited by examiner

*Primary Examiner* — John J Tabone, Jr.
(74) *Attorney, Agent, or Firm* — Kevin T. Cuenot; Thomas George

(57) ABSTRACT

A method of detecting an error when loading a programmable integrated circuit (IC) can include detecting a predetermined bit pattern indicating a start of a bitstream within the programmable IC, starting a timer within the programmable IC responsive to detecting the predetermined bit pattern, and determining whether a bitstream load complete condition has occurred prior to expiration of the timer. When the timer expires prior to an occurrence of the bitstream load complete condition, at least one recovery action can be implemented.

20 Claims, 2 Drawing Sheets

IDENTIFYING BITSTREAM LOAD ISSUES IN AN INTEGRATED CIRCUIT

FIELD OF THE INVENTION

The embodiments disclosed within this specification relate to an integrated circuit (IC). More particularly, the embodiments relate to identifying problems that occur when loading a bitstream into a programmable IC.

BACKGROUND

A programmable integrated circuit (IC) is a well-known type of integrated circuit that can be programmed to perform, e.g., specified logic functions. One type of programmable IC, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data, referred to as a bitstream, into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays and programmable array logic devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Programmable ICs can also be implemented in other ways, e.g., using fuse or antifuse technology. The phrase "programmable IC" can include, but is not limited to, these devices and further can encompass devices that are only partially programmable. For example, one type of programmable IC includes a combination of hard-coded transistor logic and a programmable switch fabric that programmably interconnects the hard-coded transistor logic.

Accordingly, to instantiate a circuit design, or a portion of a circuit design, within a programmable IC, a bitstream is loaded into the configuration memory cells of the device. In some cases, a problem can occur when loading the bitstream into the programmable IC. For example, communication between the source from which the bitstream is provided and the programmable IC can be interrupted resulting in the programmable IC not receiving any bitstream data bits or receiving only a portion of the bitstream data bits. In another example, the data bits of the bitstream can be corrupted resulting in either incomplete or incorrect data bits being provided to the programmable IC. Detecting such problems during the bitstream loading process can be important for several reasons. One reason is that an incomplete or incorrect bitstream can result in a non-functioning or malfunctioning programmable IC. Another reason is that an incomplete or incorrect bitstream can cause damage to the programmable IC.

SUMMARY

The embodiments disclosed within this specification relate to integrated circuits (ICs) and, more particularly, to identifying problems that occur when loading a bitstream into a programmable IC. One embodiment of the present invention can include a method of detecting an error when loading a programmable IC. The method can include detecting a predetermined bit pattern that indicates a start of a bitstream within the programmable IC, starting a timer within the programmable IC responsive to detecting the predetermined bit pattern, and determining whether a bitstream load complete condition has occurred prior to expiration of the timer. When the timer expires prior to an occurrence of the bitstream load complete condition, one or more recovery actions can be implemented.

In one aspect, the method can include determining a type of the bitstream as a full bitstream or a partial bitstream, calculating a timer initialization value according to the type of the bitstream, and loading the timer with the timer initialization value. The predetermined bit pattern can be a SYNC indicator.

In another aspect, the method can include determining a size of the bitstream, calculating a timer initialization value according to the size of the bitstream, and loading the timer with the timer initialization value. The predetermined bit pattern can be a SYNC indicator.

In still another aspect, the method can include determining a configuration speed of the programmable IC, calculating a timer initialization value according to the configuration speed, and loading the timer with the timer initialization value. The predetermined bit pattern can be a SYNC indicator.

In yet another aspect, starting the timer can include determining a size of the bitstream, storing the size of the bitstream as the timer initialization value, and decrementing the timer initialization value responsive to detected cycles of an external clock that controls loading of the bitstream into the programmable IC. The predetermined bit pattern can be a SYNC indicator.

The method can include determining a type of the bitstream as a full bitstream or a partial bitstream and selecting the recovery action(s), at least in part, according to the type of the bitstream. The predetermined bit pattern can be a SYNC indicator. When the type of the bitstream is a partial bitstream, implementing recovery action(s) can include identifying each frame specified by the bitstream and erasing each frame specified by the bitstream from configuration memory of the programmable IC. When the type of the bitstream is a full bitstream, implementing recovery action(s) can include erasing each frame of configuration memory within the programmable IC.

When the type of the bitstream is a partial bitstream, determining whether the bitstream load complete condition has occurred prior to expiration of the timer can include identifying each frame specified by the bitstream and determining that each frame specified by the bitstream has been stored in configuration memory of the programmable IC according to a validity check prior to expiration of the timer.

In another aspect, implementing recovery action(s) can include disabling internal access to configuration memory within the programmable IC and/or disabling a configuration memory port of the programmable IC.

Another embodiment of the present invention can include a method of detecting an error when loading a programmable IC. The method can include detecting a predetermined bit pattern indicating a start of a bitstream within the programmable IC, determining one or more attribute(s) relating to the bitstream, calculating a timer initialization value according to the attribute(s), loading a timer with the timer initialization value, and starting the timer within the programmable IC responsive to detecting the predetermined bit pattern. The method further can include determining whether a bitstream load complete condition has occurred prior to expiration of the timer and, when the timer expires prior to an occurrence of the bitstream load complete condition, implementing one or more recovery actions.

Determining attribute(s) can include determining a size of the bitstream, a type of the bitstream to be full or partial, and a configuration speed of the programmable IC. The predetermined bit pattern can be a SYNC indicator. The method further can include selecting a bitstream load complete condition from a plurality of bitstream load complete conditions according to the type of the bitstream and selecting the recovery action(s), at least in part, according to the type of the bitstream.

Another embodiment of the present invention can include a programmable IC that detects an error when loading a bitstream. The programmable IC can include bitstream processing unit that detects a predetermined bit pattern indicating a start of a bitstream received within the programmable IC and a timer coupled to the bitstream processing unit. Responsive to detecting the predetermined bit pattern, the bitstream processing unit can start the timer and determine whether a bitstream load complete condition has occurred. When the timer expires prior to an occurrence of the bitstream load complete condition, the bitstream processing unit can implement one or more recovery actions.

In one aspect, the predetermined bit pattern can be a SYNC indicator, and the bitstream processing unit can determine a type of the bitstream as a full bitstream or a partial bitstream, calculate a timer initialization value according to the type of the bitstream, and load the timer with the timer initialization value.

In another aspect, the predetermined bit pattern can be a SYNC indicator, and the bitstream processing unit can determine a size of the bitstream, calculate a timer initialization value according to the size of the bitstream, load the timer with the timer initialization value, determine a configuration speed of the programmable IC, calculate a timer initialization value according to the configuration speed, and load the timer with the timer initialization value.

The bitstream processing unit can determine a type of the bitstream as a full bitstream or a partial bitstream and select the recovery action(s), at least in part, according to the type of the bitstream. When the type of the bitstream is a partial bitstream, the bitstream processing unit can implement recovery action(s) by identifying each frame specified by the bitstream and erasing each frame specified by the bitstream from configuration memory of the programmable IC. When the type of the bitstream is a full bitstream, the bitstream processing unit can implement recovery action(s) by erasing each frame of configuration memory within the programmable IC.

The bitstream processing unit can implement recovery action(s), at least in part, by disabling internal access to configuration memory within the programmable IC and/or disabling a configuration memory port of the programmable IC.

DETAILED DESCRIPTION OF THE DRAWINGS

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the embodiments of the invention.

The embodiments disclosed within this specification relate to detecting issues that may occur when loading a bitstream into an integrated circuit (IC) such as, e.g., a programmable IC. In accordance with the embodiments disclosed herein, error conditions that occur when loading a bitstream into a programmable IC can be detected through the use of a timer. The timer can be set, e.g., initialized, and started at or about the time a bitstream to be loaded into the programmable IC is detected. When the bitstream loading process does not complete prior to the expiration of the timer, the programmable IC determines that an error has occurred and, in response, can perform one or more recovery actions. When the bitstream loading process does complete prior to the expiration of the timer, the programmable IC determines that the bitstream loading process completed successfully and that the programmable IC is functional.

Figure 1:
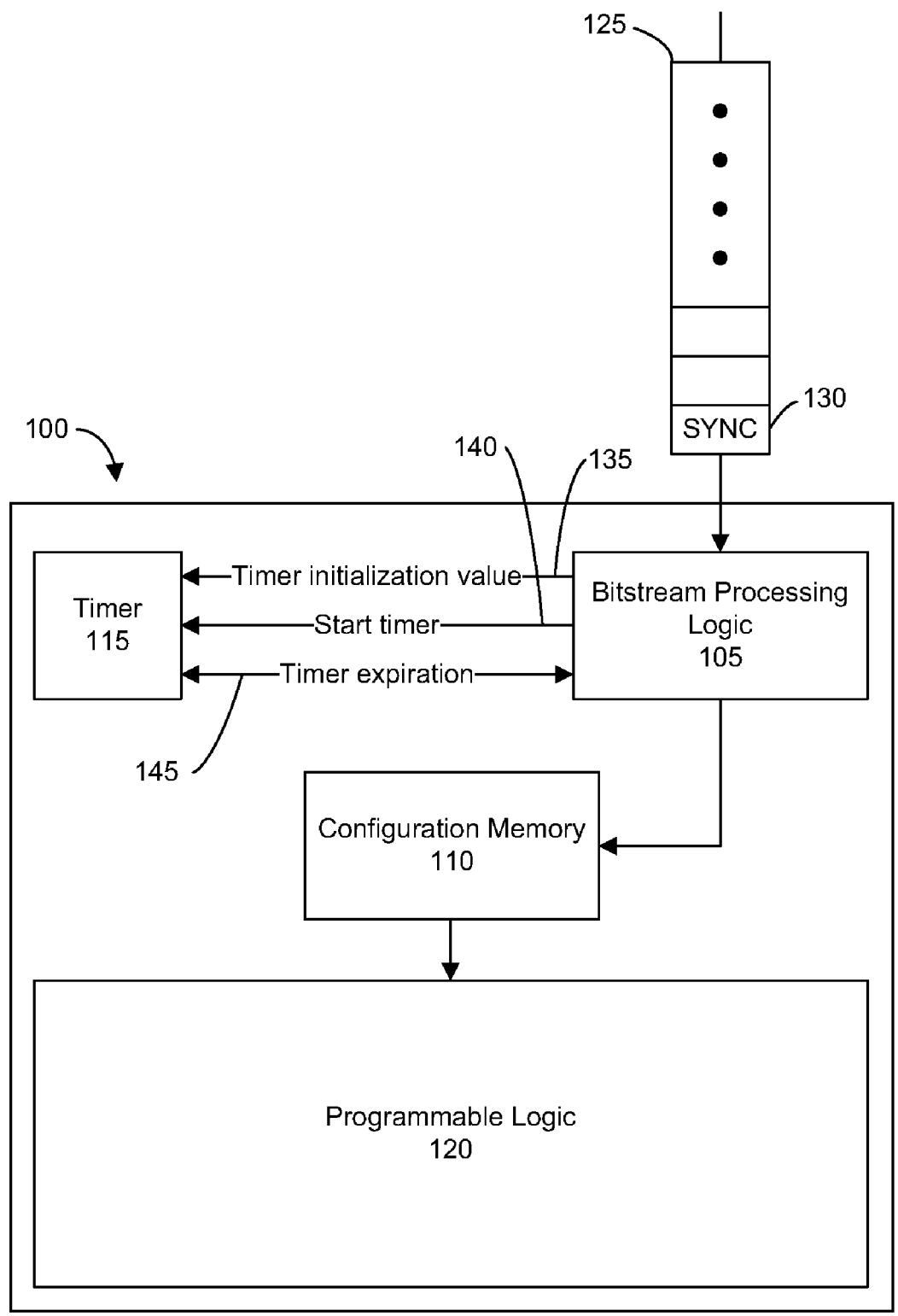
FIG. 1 is a block diagram illustrating a programmable IC configured to detect a bitstream load issue in accordance with one embodiment of the present invention.

FIG. 1 is a block diagram illustrating a programmable IC 100 configured to detect a bitstream load issue in accordance with one embodiment of the present invention. As shown, programmable IC 100 can include a bitstream processing unit such as bitstream processing logic (BPL) 105, configuration memory cells (configuration memory) 110, a timer 115, and a programmable unit such as programmable logic 120. BPL 105, configuration memory 110, and timer 115 can be pre-configured circuitry within programmable IC 100 in that each is operational without first requiring programming from a bitstream.

BPL 105 can receive a bitstream 125 from a source, whether external or internal, to programmable IC 100. BPL 105 can process bitstream 125 and determine one or more attributes relating to bitstream 125, to be described in greater detail herein. BPL 105 further can store, or load, bitstream 125 into configuration memory 110. In one embodiment BPL 105 can be implemented using dedicated circuitry such as, e.g., logic gates. In another embodiment, BPL 105 can be implemented as a processor that executes suitable program code. When executed, the program code can cause the processor to perform the various functions performed by BPL 105 as described within this specification. The embodiments disclosed herein, however, are not intended to be limited by the examples provided. BPL 105, for example, can be implemented as a combination of dedicated logic, e.g., component level circuitry, and a processor.

When loaded with a bitstream, such as bitstream 125, configuration memory 110 programs or configures programmable circuit elements such as interconnects, configurable logic blocks, input/output blocks, random access memory blocks, multipliers, digital signal processing blocks, processors, clock managers, delay lock loops, and the like of programmable logic 120. The collective states of the individual memory cells forming configuration memory 110 determines, or specifies, the functionality of programmable IC 100.

Timer 115 can be loaded with a timer initialization value. Once started, timer 115 can begin to count down from the timer initialization value to zero. When timer 115 reaches zero, timer 115 is expired. In another aspect, timer 115 can be configured to count up from zero to an upper threshold, e.g., the timer initialization value. In that case, timer 115 is expired upon counting up to, and reaching, the timer initialization value.

Timer 115 can operate under the control of BPL 105. BPL 105 can determine a particular timer initialization value, load that value into timer 115, and start timer 115 operating once loaded with the timer initialization value. Further, BPL 105 can detect the expiration of timer 115 and determine when the expiration occurs. In one embodiment, BPL 105 can poll timer 115 to determine when timer 115 has expired. In another embodiment, upon expiration, timer 115 can output a timer expiration signal to BPL 105. It should be appreciated that the particular manner in which BPL 105 determines that timer 115 has expired is not intended to limit the embodiments disclosed within this specification.

In operation, programmable IC 100 can begin in a powered on state. In one embodiment, programmable IC 100 initially does not have a circuit design instantiated therein. A bitstream loading process can be initiated upon programmable IC 100 to load a bitstream 125. In one embodiment, bitstream 125 can be a full bitstream that instantiates a circuit design within programmable IC 100 and, more particularly, within programmable logic 120. Accordingly, loading bitstream 125 into programmable IC 100 typically entails resetting and performing a complete reconfiguration of programmable IC 100. Bitstream 125, being a full bitstream, can completely overwrite the contents of configuration memory 110.

In another aspect, programmable IC 100 can be in a state where a circuit design has previously been loaded. In that case, a bitstream loading process can be initiated upon programmable IC 100 to load bitstream 125. In one embodiment, bitstream 125 can be a full bitstream as described. In another embodiment, bitstream 125 can be a partial bitstream. A partial bitstream refers to a bitstream that is loaded into programmable IC 100 without resetting programmable IC 100. The partial bitstream is loaded into one or more portions of configuration memory 110. When loaded into configuration memory 110, bitstream 125, being a partial bitstream, does not overwrite the entirety of configuration memory 110. As such, loading bitstream 125 causes only one or more selected areas of programmable IC 100 to be reconfigured, e.g., with one or more new modules, without changing the remainder of the programmable logic 120. The unchanged portions of programmable logic 120 correspond to those portions of configuration memory 110 that are not overwritten by bitstream 125. Thus, the unchanged portions of programmable logic 120 can continue to operate using the prior circuit configuration while the selected areas of programmable IC 100, corresponding to portions of configuration memory 110 overwritten by bitstream 125, are reconfigured.

In one aspect, bitstream 125 can be provided to programmable IC 100 over any of a variety of different communication links from a source external to programmable IC 100. For example, bitstream 125 can be sent to programmable IC 100 from a memory that is disposed on a same circuit board as programmable IC 100. In another example, bitstream 125 can be provided to programmable IC 100 from a host computer system or other device over a communication channel, e.g., over a network connection. The particular manner in which bitstream 125 is provided to programmable IC 100 is not intended as a limitation of the embodiments disclosed within this specification. In another aspect, for example, bitstream 125 can be stored in non-volatile memory within programmable IC 100 and downloaded into configuration memory 110.

BPL 105 can detect a SYNC indicator 130 within bitstream 125. SYNC indicator 130, in general, is a predetermined bit pattern that demarcates the start of a bitstream, whether a partial bitstream or a full bitstream. In one embodiment, SYNC indicator 130 can be a bit pattern that does not occur elsewhere within bitstream 125 as a valid word used to program programmable IC 100. In this sense, SYNC indicator 130 can uniquely identify the start of bitstream 125 as SYNC indicator 130 is distinguishable from the other portions of bitstream 125 and is not duplicated elsewhere within bitstream 125.

In one embodiment, SYNC indicator 130 can be a word in terms of bit length. Still, it should be appreciated that SYNC indicator 130 being a word is but one example and that other length indicators can be used that can be larger or smaller than a word. As such, the size of SYNC indicator 130 of bitstream 125, as described within this specification, is not limited to a particular bit length.

In response to detecting SYNC indicator 130, BPL 105 can determine one or more other attributes relating to bitstream 125. In general, some attributes determined by BPL 105 are embedded within bitstream 125 itself. For example, BPL 105 can determine a type of bitstream 125. More particularly, BPL 105 can determine the type of bitstream 125 to be a full bitstream or a partial bitstream. An identifier occurring within bitstream 125 subsequent to SYNC indicator 130 can designate the type of bitstream 125 as full or partial. In another embodiment, the size of bitstream 125 can be determined. The size of bitstream 125 also can be embedded within bitstream 125 itself, e.g., within header information after SYNC indicator 130.

Another example of an attribute relating to bitstream 125 that can be determined by, or is known by, BPL 105 can include the configuration speed of the particular model or type of programmable IC 100 that is being loaded. The configuration speed indicates the speed at which bitstream 125 can be loaded into configuration memory 110, e.g., processed and stored in configuration memory 110. The configuration speed can be expressed as a data rate in terms of bits, bytes, etc. per unit time.

For example, the configuration speed of a device typically corresponds to a configuration clock speed. The configuration speed can be measured in bits per second. Each device, e.g., programmable IC 100, typically has a default value encoded into the device that is either known a priori or that can be read from the device. In some cases, the speed of the configuration clock can be changed by a value that is embedded into a header of bitstream 125 that, when loaded into programmable IC 100, changes the default value of the configuration speed. Accordingly, when bitstream 125 includes a value that changes the configuration speed of programmable IC 100, the value read from the header of bitstream 125 can be determined as the configuration speed of programmable IC 100. In any case, given the size of bitstream 125 and the configuration speed of programmable IC 100, BPL 105 can make a more accurate estimate of the amount of time needed to load bitstream 125 into configuration memory 110. While the configuration speed and the size of bitstream 125 can be used in combination to calculate the timer initialization value, it should be appreciated that the configuration speed and the bitstream size also can be used individually and/or independently of one another if so desired.

In some cases, the bitstream loading process is controlled by a clock that is external to programmable IC 100 in lieu of the configuration clock that is onboard programmable IC 100. In that case, and in another embodiment, the number of clock cycles that are sensed can be used to count down the number of bits in bitstream 125. In this embodiment, the configuration speed need not be known. Rather, the number of bits in bitstream 125 can be used as the "timer initialization value." Accordingly, timer 115 can be loaded with the size of bitstream 125 as measured in bits. Timer 115 can be configured to decrement each time a new cycle of the external clock controlling the bitstream load process is detected. This presumes that one bit is loaded into configuration memory 110 for each detected clock cycle. It should be appreciated that if a plurality of clock cycles are required to load one bit into configuration memory, that timer 115 can be decremented after detecting the particular number of clock cycles required to load one bit. In another embodiment, timer 115 can be excluded and a memory can be used, e.g., within BPL 105, to store the bitstream size. BPL 105 can decrement the value stored in memory each time a cycle, or plurality of cycles, of the external clock is detected.

Continuing, BPL 105 can calculate the timer initialization value. The timer initialization value can be calculated according to, e.g., as a function of, the type of bitstream 125, the size of bitstream 125, the configuration speed of programmable IC 100, or any combination of type of bitstream, size of bitstream, and/or configuration speed of programmable IC 100. Once the timer initialization value is calculated, BPL 105 can load the timer initialization value into timer 115 via signal 135 and start timer 115 via signal 140.

Within this specification, the same reference characters are used to refer to terminals, wires, and their corresponding signals. In this regard, the terms "signal," "wire," "connection," "terminal," and "pin" may be used interchangeably, from time-to-time, within this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between the two, or more, components or circuit blocks coupled by a signal or wire as the case may be.

Having loaded and started timer 115, BPL 105 can begin to monitor for expiration of timer 115 and the completion of the bitstream loading process. An error is detected when BPL 105 determines that timer 115 has expired prior to the completion of the bitstream loading process. Timer expiration can be detected via signal 145. Signal 145 represents a communication link between timer 115 and BPL 105, whether BPL 105 continuously polls timer 115, whether timer 115 notifies BPL 105 of timer expiration, or the like.

When timer 115 expires prior to completion of the bitstream loading process, BPL 105 can implement one or more recovery actions. In one embodiment, the recovery action(s) to be performed can be selected by BPL 105, at least in part, as a function of the type of bitstream that is being loaded into programmable IC 100. The recovery actions can include generating an internal error notification, e.g., setting a particular signal high or low or setting a particular bit. The recovery actions also can include generating or outputting an external signal that can be observed or detected by a system external to programmable IC 100. Other recovery actions can be performed to protect programmable IC 100 from damage and to prevent bitstream 125 from being compromised, e.g., read from programmable IC 100 by unauthorized persons.

In another embodiment, timer 115 can be decoupled from the configuration clock, whether internal or external. In such an embodiment, a fixed period of time can be allotted for downloading bitstream 125 into programmable IC 100. In that case, the timer initialization value can be a predetermined value that is not dependent upon the various factors described within this specification. Upon failure of bitstream 125 to load prior to expiration of timer 115, one recovery action can include locking programmable IC 100 to prevent further configuration attempts.

For example, when programmable IC 100 only has volatile memory, BPL 105 can set a specially fabricated non-volatile memory bit (or plurality of bits). When the bit or bits are set, control logic, which may or may not be part of BPL 105, disables the configuration memory port of programmable IC 100 through which the configuration instruction or instructions are received. Disabling the configuration memory port disables the configuration instruction, e.g., SYNC indicator 130, within programmable IC 100 as programmable IC 100 has no means by which the instruction can be received. Alternatively, or in combination, when the bit or bits are set, internal access to configuration memory 110 can be disabled, e.g., by physically disconnecting signal paths leading to configuration memory 110 so that there are no paths through which configuration memory 110 can be accessed, e.g., either read from or written to, internally within programmable IC 100.

When programmable IC 100 has non-volatile memory, a specially provisioned non-volatile memory bit or plurality of bits can be set by BPL 105. When set, the configuration memory port of programmable IC 100 can be disabled. Alternatively, or in combination, BPL internal access to configuration memory 110 can be disabled.

Figure 2:
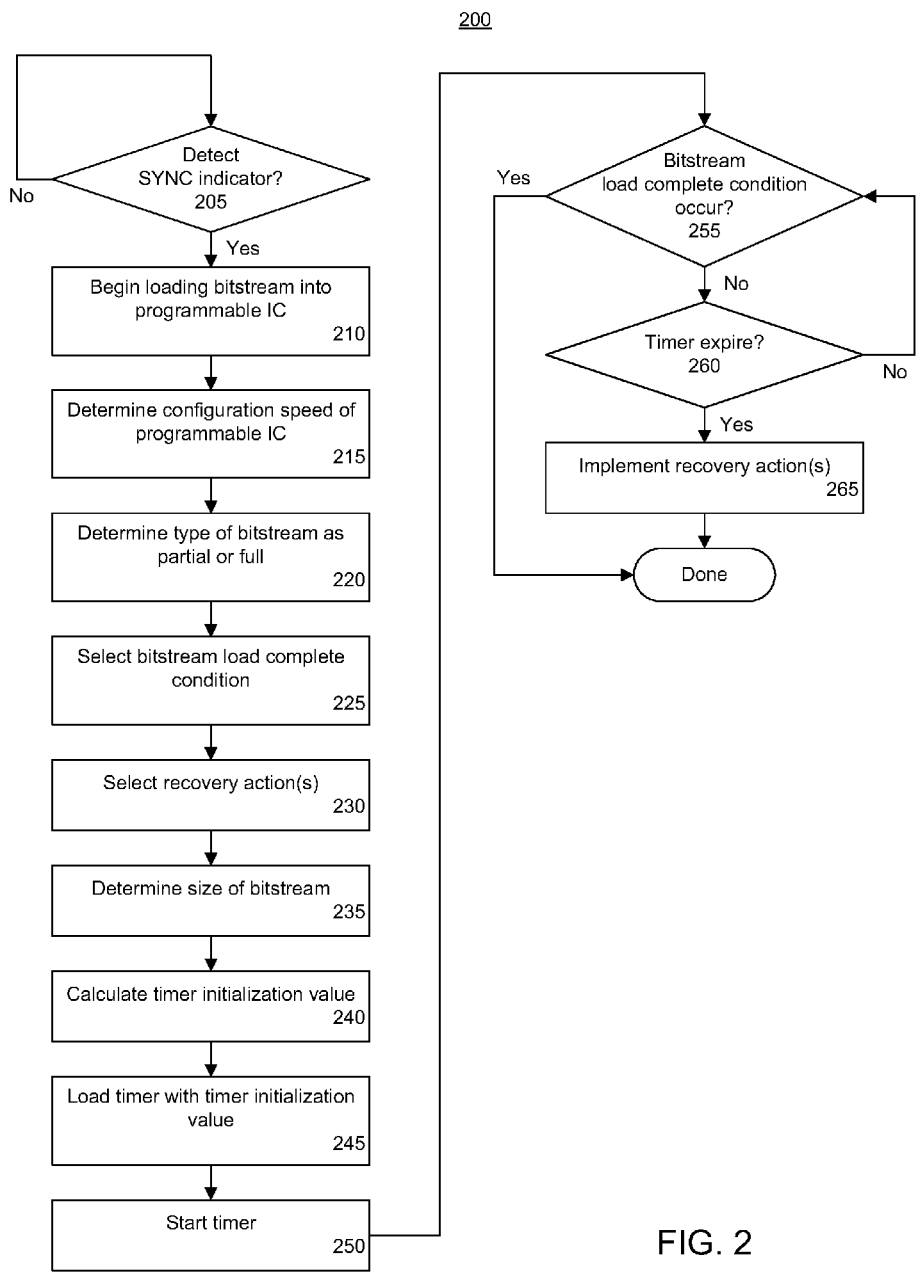
FIG. 2 is a flow chart illustrating a method of detecting a bitstream load issue in accordance with another embodiment of the present invention.

FIG. 2 is a flow chart illustrating a method 200 of detecting a bitstream load issue in accordance with another embodiment of the present invention. Method 200 can be implemented using a programmable IC, as described with reference to FIG. 1, to detect an error, e.g., an issue or problem, that occurs when loading a bitstream into a programmable IC. Accordingly, method 200 can begin with the programmable IC in a powered on state and disposed upon a suitable electronic system, e.g., a circuit board or the like.

In step 205, the programmable IC, and particularly the BPL, can begin to monitor a data port of the programmable IC through which a bitstream can be received for the occurrence of a SYNC indicator. When no SYNC indicator is detected, method 200 can continue looping to monitor for the occurrence of the SYNC indicator. As noted, the SYNC indicator typically is the first word used within a bitstream to identify the incoming data bits as a bitstream for configuring the programmable IC, whether a partial bitstream or a full bitstream. When the SYNC indicator is detected, method 200 can proceed to step 210.

In step 210, having identified the incoming data bits as a bitstream through detection of the SYNC indicator, the programmable IC can begin to load the bitstream. More particularly, the BPL can begin to load and process the bitstream. In step 215, the BPL can determine the configuration speed of the programmable IC. In one embodiment, the configuration speed can be predetermined and stored within BPL or another memory and vary according to the type and/or model of the programmable IC. As noted, the configuration speed also can be set by the received bitstream. In step 220, the BPL can determine the type of bitstream that is being received. An identifier within the bitstream identifies the bitstream as a full bitstream or a partial bitstream.

In step 225, the BPL can select a bitstream load complete condition. The BPL monitors for the occurrence of a bitstream load complete condition as well as the expiration of the timer. In one embodiment, the bitstream load complete condition can be selected according to the type of bitstream that is being loaded. Accordingly, the particular criteria that is checked in determining whether the bitstream load complete condition has been met, or occurred, differs according to whether the bitstream is a full bitstream or a partial bitstream. The selected bitstream load complete condition specifies one or more criteria that, when met, indicate that the bitstream has been successfully loaded into configuration memory of the programmable IC and that the programmable IC has been successfully configured with the loaded bitstream, e.g., the programmable IC is executing the newly loaded circuit or sub-circuit as the case may be.

In the case of a full bitstream, for example, the bitstream load complete condition can be indicated by a "DONE" signal output by the programmable IC. The DONE signal can be a signal that is output and available only internally within the programmable IC or can be a signal that is output and available from the programmable IC, e.g., on a pin, and is therefore available to other external systems. Typically, just as the start of a bitstream is indicated by the SYNC indicator, the end of a bitstream is indicated by the occurrence of a particular predetermined bit pattern. When that bit pattern indicating the end of the bitstream, e.g., the "ending indicator," is detected, the programmable IC can begin a startup sequence.

In another embodiment, rather than detecting an ending indicator, a state can be detected by BPL 105. For example, the startup sequence can begin automatically once the bitstream has ended and no further data bits of the bitstream have been detected, or when the correct number of bits, as indicated by the size of the bitstream in the header information, have been received. A state corresponding to a successful completion of the startup sequence within the programmable IC can be detected.

The startup sequence includes operations or tasks such as setting up internal options of the programmable IC, shutting off local tristate signals, ensuring that all block random access memories are active, turning on and synchronizing digital locked loops, and the like. Ultimately, as part of the startup sequence, the circuit design specified by the bitstream takes control of the programmable IC. At the conclusion of the startup sequence, presuming each operation is successfully completed, the DONE signal can be output.

In the case of a partial bitstream, the startup sequence is not performed as the programmable IC is already operational and portions of the programmable IC continue to operate while the partial bitstream is written into the configuration memory. The DONE signal also remains active and, therefore, provides no indication as to whether the partial bitstream was successfully loaded into configuration memory. As such, different criteria must be used to determine that the bitstream load complete condition has occurred in the case of a partial bitstream.

In one embodiment, the bitstream load complete condition can be defined as follows for a partial bitstream. Each frame that is received as part of the partial bitstream can be identified. A list including each frame received within the partial bitstream can be maintained in the BPL. When the ending indicator of the bitstream is detected by the BPL, or the number of bits specified by the size of the bitstream have been received and loaded into configuration memory, the BPL can determine whether a cycle redundancy check (CRC) has been performed for each frame specified on the list. If each frame on the list has been loaded into, e.g., stored in, configuration memory and has a CRC check indicating a valid frame, then the bitstream load complete condition can be determined to have occurred for a partial bitstream. As noted, the DONE signal does not change state in the case of a partial bitstream.

With regard to partial bitstreams, it should be appreciated that any of a variety of different criteria can be used to signify the occurrence of a bitstream load complete condition indicating that each frame received in the partial bitstream has been successfully and accurately written to configuration memory. These different criteria can include, for example, parity check mechanisms, checksums that are not polynomial-based, or the like. As such, the particular set of criteria that can be used to indicate whether a load complete condition has occurred can vary and are not intended to limit the embodiments described within this specification.

In general, configuration memory can be organized into series of frames of a given width, e.g., one bit. Each frame can span a portion of the programmable IC. For example, a frame, when loaded into configuration memory, can configure an entire column of a programmable IC or a portion of a column of the programmable IC depending upon the architecture of the programmable IC being configured. In any case, a frame generally refers to the smallest unit of memory that can be read from configuration memory or written to configuration memory of the programmable IC. As such, the bitstream also can be organized into frames and processed as described.

In step 230, one or more recovery actions can be selected. As used herein, a "recovery action" refers to an action or task performed by the programmable IC when the timer expires prior to detecting a bitstream load complete condition. In one embodiment, the recovery action(s) can be selected according to the type of the bitstream loaded into the programmable IC. In the case of a full bitstream, for example, one recovery action that can be selected is the erasure of the entire programmable IC. More particularly, the entire contents of the configuration memory of the programmable IC can be erased. In the case of a partial bitstream, a recovery action can include erasing each frame of configuration memory that is specified on the list of frames received as part of the partial bitstream. More particularly, each frame in the list of frames can be identified within configuration memory and erased.

Another example of a recovery action can include attempting to reload the bitstream, whether partial or full. For example, the programmable IC can output a signal as part of a recovery action that, when detected by another system, causes that system to attempt to reload a bitstream into the programmable IC. Still another example of a recovery action can include turning control of the programmable IC back over to the user, e.g., to take control away from the circuit, or portion of the circuit, that is instantiated within the programmable IC. In that case, no further action can be taken by the programmable IC. The user can conduct any diagnostics that may be desired. Yet another example of a recovery action can include generating an error signal that can be made available external to the programmable IC that indicates that a timeout condition has occurred during the loading of the bitstream.

In step 235, the BPL can determine the size of the bitstream. The BPL, for example, can read a value within the header data that indicates the total length, e.g., size, of the bitstream being loaded into the programmable IC. In another embodiment, for example, where the bitstream is stored in a buffer prior to being loaded into configuration memory, the BPL can determine the size of the bitstream by virtue of the amount of buffer space needed to store the bitstream. In such an embodiment, the buffer includes only bitstream data to ensure that the calculations of the amount of buffer space left are accurate and not skewed by other data, e.g., non-bitstream data, also stored in the buffer.

In step 240, the BPL can calculate a timer initialization value. The timer initialization value can be calculated as a function of the size of the bitstream, the type of the bitstream, the configuration rate of the programmable IC and/or or any combination thereof. Thus, the timer initialization value calculated for a first bitstream will, in general, be smaller than the timer initialization value calculated for a second bitstream that is larger than the first bitstream. Likewise, the timer initialization value calculated for a partial bitstream will be smaller than the timer initialization value calculated for a full bitstream. Such is the case by virtue of the smaller size of the partial bitstream and the fact that the startup sequence is not performed for a partial bitstream. The higher the configuration rate of the programmable IC, the less time required to load a given bitstream having a fixed size. The timer initialization value can be calculated to be a value that, when loaded into the timer, and the timer expires, provides sufficient time for the particular bitstream to be successfully loaded into the programmable IC, given the configuration rate of the programmable IC. It should be appreciated that the timer initialization value can include a margin of error that effectively increases the timer initialization value by a fixed amount, a percentage, or the like.

In step 245, the BPL can load the timer with the timer initialization value. In step 250, the BPL can start the timer. In step 255, the BPL can determine whether the selected bitstream load complete condition has occurred. When the selected bitstream load complete condition occurs prior to expiration of the timer, method 200 can end as the bitstream has been successfully loaded into the programmable IC.

When the bitstream load complete condition has not occurred, method 200 can proceed to step 260. In step 260, the BPL can determine whether the timer has expired. When the timer expires prior to the occurrence of the bitstream load complete condition, an error is presumed to have occurred. An incomplete or partially written bitstream may cause damage to the programmable IC. As such, it is worthwhile to identify such a condition and implement any enumerated recovery action(s). Accordingly, when the timer expires prior to the detection of the bitstream load complete condition, method 200 can proceed to step 265. When the timer has not yet expired, the method can loop back to step 255 to continue monitoring for the selected bitstream load complete condition.

Continuing with step 265, the selected recovery action(s) can be implemented. As noted, the selected recovery action(s) can be selected according to the type of bitstream that is being loaded. Further, one or more recovery actions, or parameters of such actions, can be selected or specified by a user. For example, it can be a matter of user preference as to whether the programmable IC attempts to reload a bitstream or whether to turn control of the programmable IC back over to the user. In the case of a partial bitstream, the user may or may not wish to delete frames of configuration memory that were specified by the partial bitstream. Such options can be user selectable in that a user may determine or specify the particular recovery action(s) to be performed for a full bitstream and/or for a partial bitstream when the timer expires prior to the bitstream load complete condition occurring. After step 265, the method can end.

The embodiments disclosed within this specification describe methods and systems relating to the detection of problems when loading a bitstream into a programmable IC. By detecting when a bitstream is not successfully loaded into the programmable IC, damage to the device can be avoided. Further, users can be made aware of the issue to pursue corrective strategies as well as strategies designed to prevent unauthorized access to circuit designs, or portions thereof, stored within the programmable IC.

The flowcharts in the figures illustrate the architecture, functionality, and operation of possible implementations of systems and methods according to various embodiments of the present invention. It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. Embodiments of the present invention can be realized in hardware or a combination of hardware and software.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements. Two elements also can be coupled mechanically, electrically, or communicatively linked through a communication channel, pathway, network, or system.

The embodiments disclosed herein can be embodied in other forms without departing from the spirit or essential attributes thereof. Accordingly, reference should be made to the following claims, rather than to the foregoing specification, as indicating the scope of the various embodiments of the present invention.

What is claimed is:

1. A method of detecting an error when loading a programmable integrated circuit (IC), the method comprising:
   detecting a predetermined bit pattern that indicates a start of a bitstream within the programmable IC;
   calculating a timer initialization value based on an attribute of the bitstream or the programmable IC, and loading a timer with the timer initialization value;
   starting the timer within the programmable IC responsive to detecting the predetermined bit pattern;
   determining whether a bitstream load complete condition has occurred prior to expiration of the timer; and
   when the timer expires prior to an occurrence of the bitstream load complete condition, implementing at least one recovery action.

2. The method of claim 1, further comprising:
determining a type of the bitstream as a full bitstream or a partial bitstream,
wherein calculating the timer initialization value comprises calculating the timer initialization value according to the type of the bitstream, and
wherein the predetermined bit pattern is a SYNC indicator.

3. The method of claim 1, further comprising:
determining a size of the bitstream,
wherein calculating the timer initialization value comprises calculating the timer initialization value according to the size of the bitstream, and
wherein the predetermined bit pattern is a SYNC indicator.

4. The method of claim 1, further comprising:
determining a configuration speed of the programmable IC,
wherein calculating the timer initialization value comprises calculating the timer initialization value according to the configuration speed, and
wherein the predetermined bit pattern is a SYNC indicator.

5. The method of claim 1, further comprising:
determining a size of the bitstream,
wherein calculating the timer initialization value comprises storing the size of the bitstream as the timer initialization value; and
decrementing the timer initialization value responsive to detected cycles of an external clock that control loading of the bitstream into the programmable IC,
wherein the predetermined bit pattern is a SYNC indicator.

6. The method of claim 1, further comprising:
determining a type of the bitstream as a full bitstream or a partial bitstream; and
selecting the at least one recovery action, at least in part, according to the type of the bitstream,
wherein the predetermined bit pattern is a SYNC indicator.

7. The method of claim 6, wherein the type of the bitstream is a partial bitstream, wherein implementing at least one recovery action comprises:
identifying each frame specified by the bitstream; and
erasing each frame specified by the bitstream from configuration memory of the programmable IC.

8. The method of claim 6, wherein the type of the bitstream is a full bitstream, wherein implementing at least one recovery action comprises erasing each frame of configuration memory within the programmable IC.

9. The method of claim 6, wherein the type of the bitstream is a partial bitstream, wherein determining whether the bitstream load complete condition has occurred prior to expiration of the timer comprises:
identifying each frame specified by the bitstream; and
determining that each frame specified by the bitstream has been stored in configuration memory of the programmable IC according to a validity check prior to expiration of the timer.

10. The method of claim 1, wherein implementing at least one recovery action comprises at least one of disabling internal access to configuration memory within the programmable IC or disabling a configuration memory port of the programmable IC.

11. A method of detecting an error when loading a programmable integrated circuit (IC), the method comprising:
detecting a predetermined bit pattern indicating a start of a bitstream within the programmable IC;
determining at least one attribute relating to the bitstream;
calculating a timer initialization value according to the at least one attribute and loading a timer with the timer initialization value;
starting the timer within the programmable IC responsive to detecting the predetermined bit pattern;
determining whether a bitstream load complete condition has occurred prior to expiration of the timer; and
when the timer expires prior to an occurrence of the bitstream load complete condition, implementing at least one recovery action.

12. The method of claim 11, wherein the predetermined bit pattern is a SYNC indicator, and wherein determining at least one attribute comprises determining a size of the bitstream, a type of the bitstream to be full or partial, and a configuration speed of the programmable IC.

13. The method of claim 12, further comprising:
selecting a bitstream load complete condition from a plurality of bitstream load complete conditions according to the type of the bitstream; and
selecting the at least one recovery action according, at least in part, to the type of the bitstream.

14. A programmable integrated circuit (IC) that detects an error when loading a bitstream, the programmable IC comprising:
bitstream processing unit that detects a predetermined bit pattern indicating a start of a bitstream received within the programmable IC, wherein the bitstream processing unit calculates a timer initialization value based on an attribute of the bitstream or the programmable IC; and
a timer coupled to the bitstream processing unit,
wherein the bitstream processing unit loads the timer with the timer initialization value, and
wherein, responsive to detecting the predetermined bit pattern, the bitstream processing unit starts the timer and determines whether a bitstream load complete condition has occurred, and wherein, when the timer expires prior to an occurrence of the bitstream load complete condition, the bitstream processing unit implements at least one recovery action.

15. The programmable IC of claim 14, wherein the predetermined bit pattern is a SYNC indicator, and wherein the bitstream processing unit determines a type of the bitstream as a full bitstream or a partial bitstream, and calculates the timer initialization value according to the type of the bitstream.

16. The programmable IC of claim 14, wherein the predetermined bit pattern is a SYNC indicator, and wherein the bitstream processing unit:
determines a size of the bitstream,
determines a configuration speed of the programmable IC,
calculates the timer initialization value according to at least one of the size of the bitstream and the configuration speed.

17. The programmable IC of claim 14, wherein the predetermined bit pattern is a SYNC indicator, and wherein the bitstream processing unit determines a type of the bitstream as a full bitstream or a partial bitstream and selects the at least one recovery action, at least in part, according to the type of the bitstream.

18. The programmable IC of claim 17, wherein the type of the bitstream is a partial bitstream, wherein the bitstream processing unit implements the at least one recovery action by:
identifying each frame specified by the bitstream; and
erasing each frame specified by the bitstream from configuration memory of the programmable IC.

19. The programmable IC of claim 17, wherein when the type of the bitstream is a full bitstream, the bitstream processing unit implements the at least one recovery action by erasing each frame of configuration memory within the programmable IC.

20. The programmable IC of claim 14, wherein the bitstream processing unit implements the at least one recovery action, at least in part, by performing at least one of disabling internal access to configuration memory within the programmable IC or disabling a configuration memory port of the programmable IC.

* * * * *